United States Patent
Leverington

(10) Patent No.: US 9,804,585 B2
(45) Date of Patent: Oct. 31, 2017

(54) COMPUTER PROGRAM AND METHOD FOR EVALUATING A CRANKSHAFT

(71) Applicant: DEERE & COMPANY, Moline, IL (US)

(72) Inventor: James M Leverington, Waterloo, IA (US)

(73) Assignee: Deere & Company, Moline, IL (US)

( * ) Notice: Subject to any disclaimer, the term of this patent is extended or adjusted under 35 U.S.C. 154(b) by 538 days.

(21) Appl. No.: 14/445,660

(22) Filed: Jul. 29, 2014

(65) Prior Publication Data

US 2016/0033957 A1    Feb. 4, 2016

(51) Int. Cl.

| | |
|---|---|
| *G06F 19/00* | (2011.01) |
| *G05B 19/4097* | (2006.01) |
| *G06F 17/50* | (2006.01) |
| *B23Q 17/24* | (2006.01) |
| *G05B 19/418* | (2006.01) |
| *G05B 19/42* | (2006.01) |
| *B23Q 17/20* | (2006.01) |

(52) U.S. Cl.
CPC ......... *G05B 19/4097* (2013.01); *B23Q 17/20* (2013.01); *B23Q 17/2471* (2013.01); *G05B 19/41875* (2013.01); *G05B 19/4207* (2013.01); *G06F 17/50* (2013.01)

(58) Field of Classification Search
CPC .................................................. G05B 19/4097
USPC ................................................... 700/90–129
See application file for complete search history.

(56) References Cited

U.S. PATENT DOCUMENTS

| | | | |
|---|---|---|---|
| 4,300,197 A | 11/1981 | Schonfeld et al. | |
| 4,884,210 A | 11/1989 | Blaimschein | |
| 6,397,463 B1 | 6/2002 | Assie | |
| 6,999,846 B2 | 2/2006 | Kato et al. | |
| 2009/0276145 A1* | 11/2009 | Schafer | F01L 1/024 701/105 |
| 2009/0312932 A1* | 12/2009 | Wang | F02D 35/024 701/102 |
| 2010/0179675 A1* | 7/2010 | Yoshimoto | G01M 1/24 700/98 |
| 2012/0037110 A1 | 2/2012 | Perkins | |
| 2012/0259452 A1 | 10/2012 | Yoshimoto | |
| 2012/0312273 A1* | 12/2012 | Weverka | F16C 3/06 123/197.3 |

(Continued)

FOREIGN PATENT DOCUMENTS

| | | |
|---|---|---|
| CN | 201077006 Y | 6/2008 |
| CN | 202008425 U | 10/2011 |

(Continued)

OTHER PUBLICATIONS

Kimmich, Frank, Anselm Schwarte, and Rolf Isermann. "Fault detection for modern Diesel engines using signal-and process model-based methods." Control Engineering Practice 13.2 (2005): pp. 189-203.*

(Continued)

*Primary Examiner* — Satish Rampuria

(57) ABSTRACT

A method for evaluating a crankshaft. The method comprises receiving data related to a three dimensional scan of the crankshaft, generating a crankshaft computer model based on the data, and determining whether the crankshaft is suitable for machining into a machined crankshaft based on the crankshaft computer model.

20 Claims, 4 Drawing Sheets

(56) References Cited

U.S. PATENT DOCUMENTS

| | | | | |
|---|---|---|---|---|
| 2013/0080104 A1* | 3/2013 | Boehl | ............... | G01D 5/24471 |
| | | | | 702/94 |
| 2013/0098335 A1* | 4/2013 | Diggs | ................... | F01B 15/02 |
| | | | | 123/45 R |
| 2013/0118243 A1* | 5/2013 | Jessen | ............... | F02D 41/0085 |
| | | | | 73/114.45 |
| 2013/0158781 A1* | 6/2013 | Sugimoto | ................ | B63B 9/00 |
| | | | | 701/34.2 |

FOREIGN PATENT DOCUMENTS

| | | |
|---|---|---|
| CN | 202447712 U | 9/2012 |
| EP | 2184595 A1 | 5/2010 |
| EP | 2305420 A1 | 4/2011 |
| JP | 2007264746 A | 10/2007 |

OTHER PUBLICATIONS

Thelen, Darryl G., Frank C. Anderson, and Scott L. Delp. "Generating dynamic simulations of movement using computed muscle control." Journal of biomechanics 36.3 (2003): pp. 321-328.*

Huang, Hong-Zhong, Ruifeng Bo, and Wei Chen. "An integrated computational intelligence approach to product concept generation and evaluation." Mechanism and Machine Theory 41.5 (2006): pp. 567-583.*

European Search Report issued in counterpart application No. 15177123.5, dated Dec. 7, 2015 (9 pages).

European Communication pursuant to Article 94(3) EPC issued in counterpart application No. 15177130.0, dated Jun. 13, 2017 (7 pages).

* cited by examiner

COMPUTER PROGRAM AND METHOD FOR EVALUATING A CRANKSHAFT

FIELD OF THE DISCLOSURE

The present disclosure relates to a computer program and method for evaluating a crankshaft.

BACKGROUND OF THE DISCLOSURE

Reciprocating engines have machined crankshafts that rotate at high speeds, and also have pistons and connecting rods that oscillate up and down with every revolution of the machined crankshaft. These parts are referred to as the engine's rotating assembly. Machined crankshafts need to be highly engineered, so as to maximize the efficiency of the energy conversion process and also to resist shock loading issues and fatigue failure. Further, machined crankshafts need to be light and small, so as to provide fast response times and to be compact enough to fit inside of an engine block.

Crankshafts may be made by a deformation process in which the work is compressed between a pair of dies, using either impact or gradual pressure to form the part. Over time, the dies change and cause latent changes between (respective) crankshafts. As just one example, when the dies form the crankshaft, there may be a thin web left thereon where the two dies meet. The size of the thin web varies between the crankshafts, as its size is related to how much wear there is on the dies.

Engine designers specify material distribution in critical areas for ensuring that mechanical material limits of the machined crankshaft are not exceeded. For example, a pin journal of the machined crankshaft transmits energy of the piston through the web of material that joins the pin journal to the main journal. There must be enough material that is properly located in the web for preventing failure thereof. In at least some cases, the web and the pin journals have been identified as the weakest areas of the machined crankshaft. Despite the importance and potential weakness of the web and pin journals, they may be defect prone. The heated steel used to form the crankshaft is subjected to the highest flow rate and restrictions in the pin journal area, resulting in a higher likelihood of die wear in these particular areas and a higher likelihood of improper die fill. Further, the pin journals lie on a parting line where upper and lower dies join together in the forging process, resulting in misplaced material caused by the dies shifting relative to each other or the dies not closing completely.

One manufacturing method is to visually inspect each crankshaft for issues relating to improper die fill and misplaced material; however, such a method is labor intensive and subject to human error.

SUMMARY OF THE DISCLOSURE

Disclosed is a method for evaluating a crankshaft. The method comprises receiving data related to a three dimensional scan of the crankshaft, generating a crankshaft computer model based on the data, and determining whether the crankshaft is suitable for machining into a machined crankshaft based on the crankshaft computer model.

BRIEF DESCRIPTION OF THE DRAWINGS

The detailed description of the drawings refers to the accompanying figures in which.

Like reference numerals in the various drawings indicate like elements.

DETAILED DESCRIPTION OF THE DRAWINGS

Figure 1:
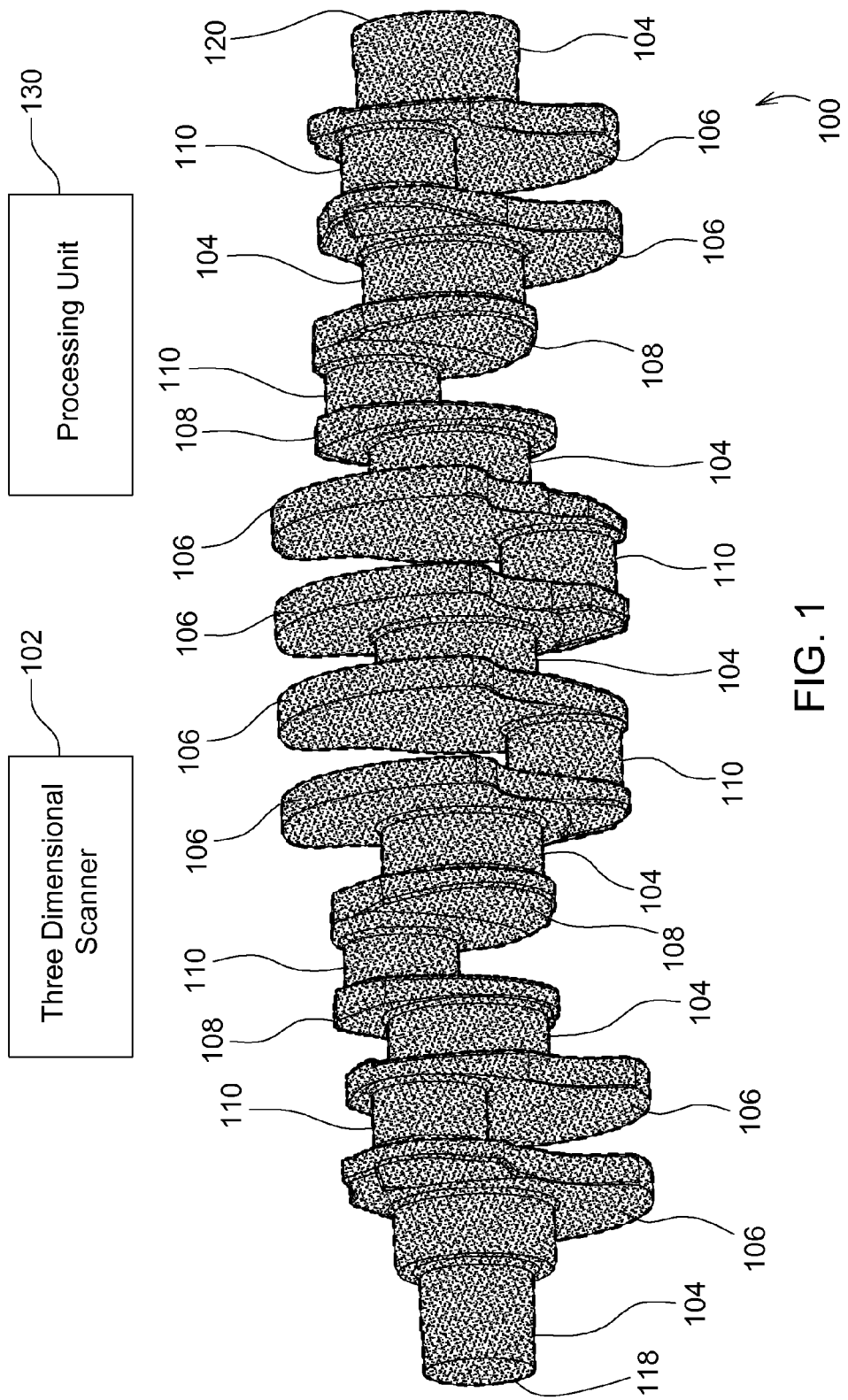
FIG. 1 is a perspective view of an example crankshaft.
Figure 2:
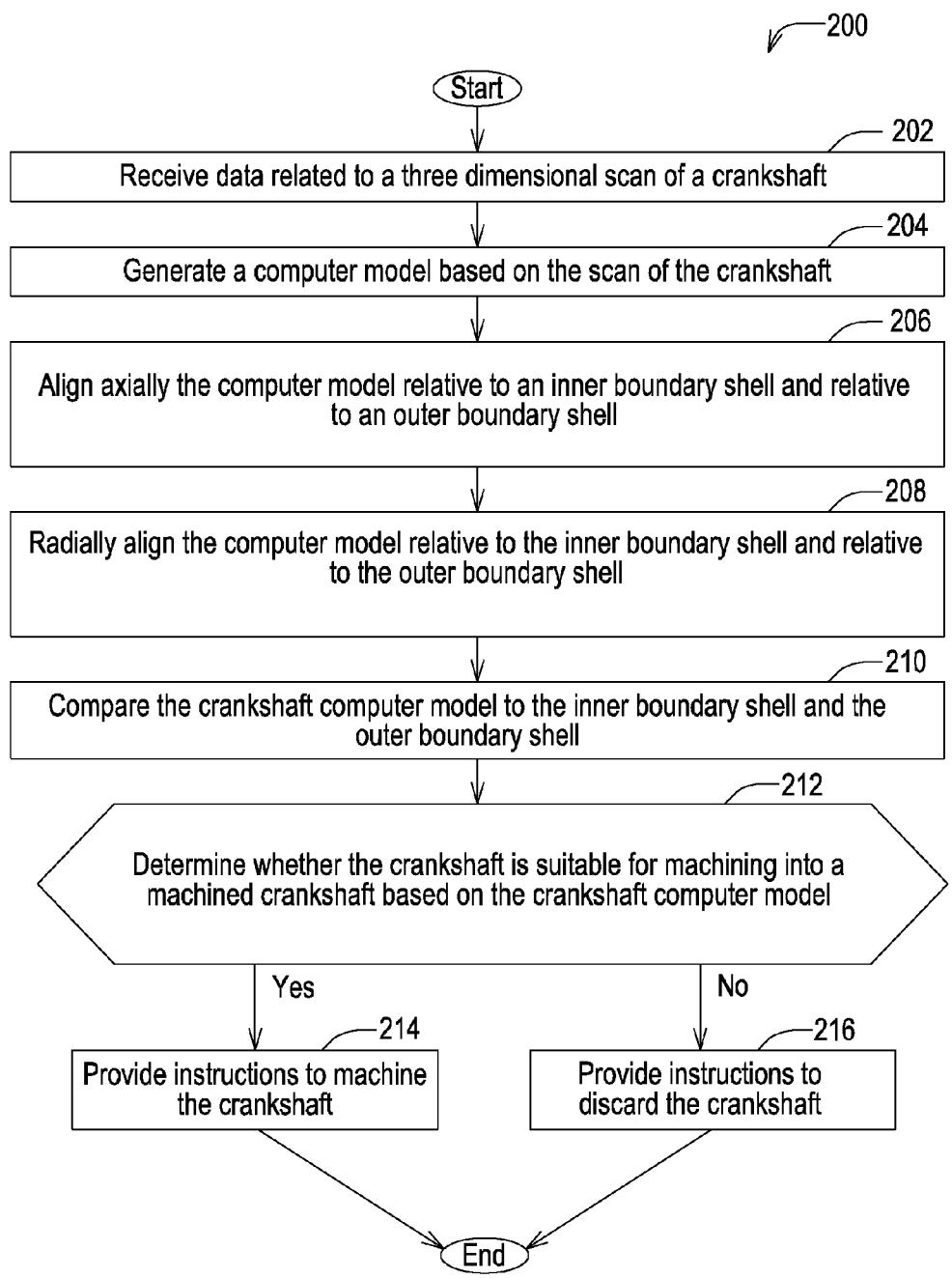
FIG. 2 is an example of a method for evaluating the crankshaft.
Figure 3:
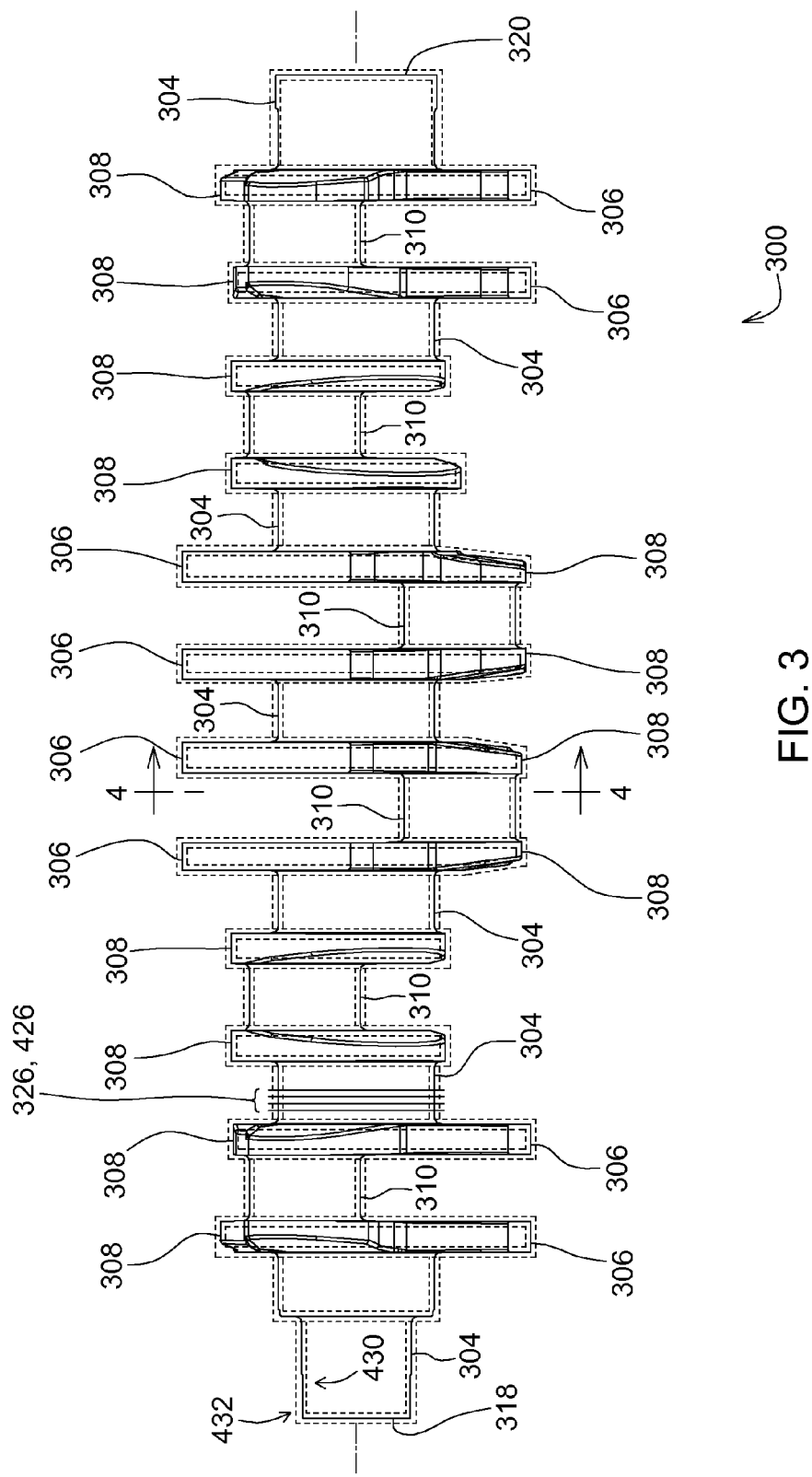
FIG. 3 is an elevational view, illustrating an external shell of a crankshaft computer model being in axial alignment with an inner boundary shell and an outer boundary shell.
Figure 4:
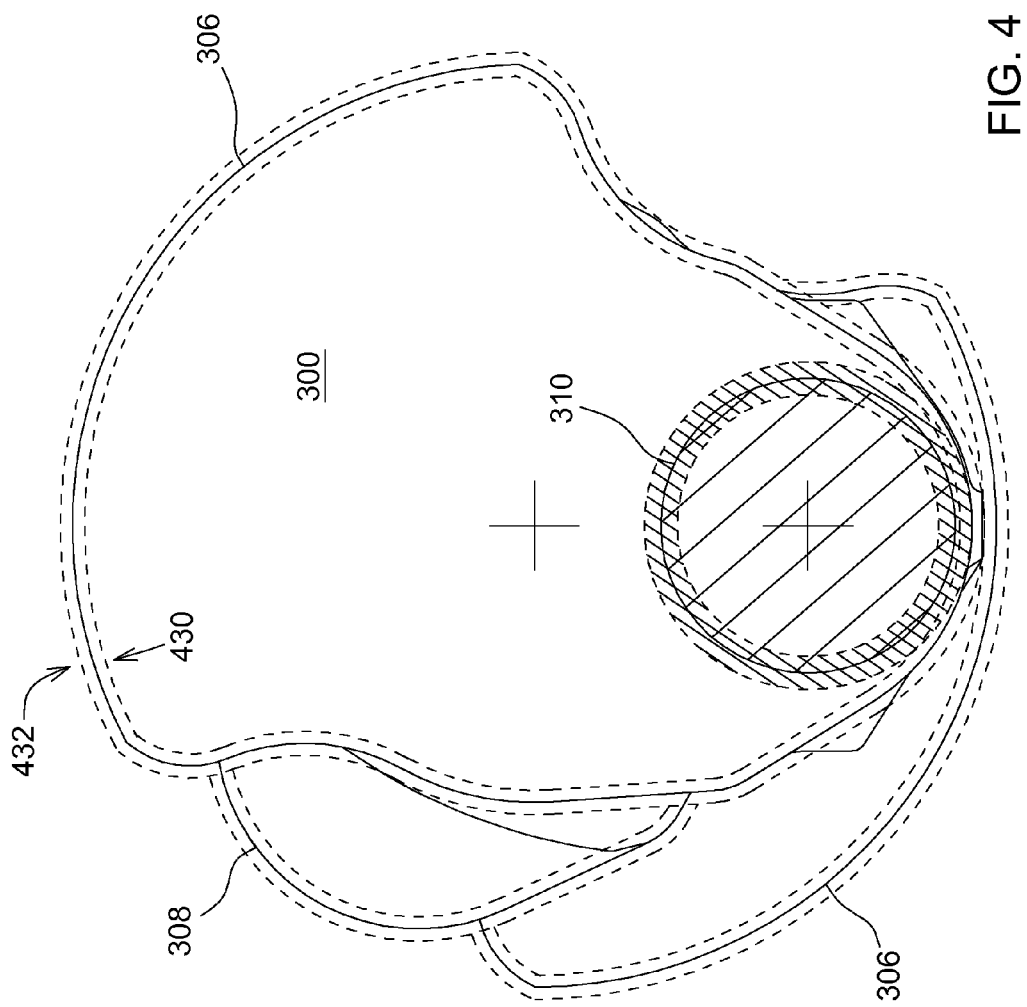
FIG. 4 is a cross section of FIG. 3 taken along lines 4-4, illustrating the external shell of the crankshaft computer model being in radial alignment with the inner boundary shell and the outer boundary shell.

Shown in FIG. 1 is one embodiment of a crankshaft 100 for use in an internal combustion engine, and shown in FIG. 2 is a method 200 for evaluating the crankshaft 100. While the crankshaft 100 is shown as being one for use in a six cylinder internal combustion engine, the method 200 may be used with various sizes and styles of crankshafts. The crankshaft 100 may be used in a variety of machines, including on-highway trucks, construction vehicles, marine vessels, stationary generators, automobiles, agricultural tractors, agricultural vehicles, and recreational vehicles.

The crankshaft 100 includes main journals 104 used as the pivoting links with respect to the crankcase of the engine. Further, the crankshaft 100 includes crankpin journals 110, each of which are shifted in relation to the main journals 104 and each of which link with a connecting rod, and coupled to each connecting rod is a piston for moving in a cylinder. The crankpin journals 110 are positioned between the main journals 104 and shifted therefrom by arms 108, ensuring not only their shifting but also their spacing between the main journals 104 and crankpin journals 110. The arms 108 include counterweights 106 for balancing the unbalance due to the shifting of the mass of the main journals 104 and crankpin journals 110.

Referring further to FIGS. 1-2, at 202, a processing unit 130 receives data related to a three dimensional scan of the crankshaft 100. In an example embodiment, the processing unit 130 is a device that executes sequences of instructions, in the form of a computer program, contained in a memory. Execution of the sequences of instructions causes the processing unit 130 to perform steps such as generating control signals. The instructions may be loaded in a random access memory (RAM) for execution by the processing unit 130 from a read only memory (ROM), a mass storage device, or some other persistent storage. In other embodiments, hard wired circuitry may be used in place of or in combination with software instructions to implement the functions described. For example, the processing unit 130 may be embodied as part of one or more application-specific integrated circuits (ASICs). Unless otherwise specifically noted, the processing unit 130 is not limited to any specific combination of hardware circuitry and software, nor to any particular source for the instructions executed by the processing unit 130.

In an example embodiment, the term "computer program" means any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution by the processing unit 130.

The three dimensional scan may be taken by a three dimensional scanner 102 that scans the crankshaft 100. The three dimensional scanner 102 may be a device for analyzing an object and for collecting data related to its shape. The three dimensional scanner 102 may create a point cloud of geometric samples on the surface of the objects, so that the points can then be used to extrapolate the shape thereof. The three dimensional scanner 102 may be a non-contact active scanner, a kind that emits some kind of radiation or light and then detects its reflection or radiation passing through the object. As another example, the three dimensional scanner 102 may be a non-contact passive scanner, a kind that does not emit any radiation, but instead relies on detecting reflected ambient radiation. Some scanners of this kind detect visible light, because it is readily available ambient radiation. One example of a non-contact passive scanner is a stereoscopic system, which employs two video cameras spaced apart from one another, so as to look at the same scene from different angles. By analyzing the slight differences between the images, it is possible to determine the distance to each point for reconstructing the object.

Further, at 204, the processing unit 130 generates a crankshaft computer model 300 based on the scanning of the crankshaft 100. The model 300 may represent at least an external shell 332 of the crankshaft 100 (e.g., the shape of the crankshaft 100). In at least some embodiments of the method 200, the model 300 is a three dimensional array. The three dimensional array may be made of a plurality of ones and zeroes, wherein the ones may represent where material of the crankshaft 100 is present and the zeroes represent where material is not present, for example. This plurality of values may indicate the shape defined by the crankshaft 100. And by knowing the shape and assuming that it is homogenous, the method 200 may be calculate all places where the crankshaft 100 has material present, in contrast to where it does not (i.e., simply an area surrounding the crankshaft 100). The model 300, because it is based on the crankshaft 100, may include modeled main journals 304, modeled counterweights 306, modeled arms 308, modeled crankpin journals 310, a modeled first end 318, and a modeled second end 320.

At 206, the processing unit 130 may axially align the external shell 332 with corresponding sections of an inner boundary shell 430, and additionally it may axially align the external shell 332 with the corresponding sections of an outer boundary shell 432. The inner boundary shell 430 represents at least a threshold between a crankshaft comprising an appropriate amount of material and a crankshaft comprising insufficient material. For example, the inner boundary shell 430 may be representative of a smallest crankshaft that is still large enough for the crankshaft 100 to be machined into a machined crankshaft capable of meeting design and use requirements related thereto. In contrast, the outer boundary shell 432 may represent at least a threshold between a crankshaft comprising an appropriate amount of material and a crankshaft comprising unwanted material. For example, the outer boundary shell 432 may be representative of a largest crankshaft that does not potentially result in at least one of (1) damage to machine tools used for machining the crankshaft 100 into the machined crankshaft and (2) excessive machining operations related thereto.

At 206, the processing unit 130 may axially align slices 326 of the external shell 332 with corresponding slices 426 of the inner boundary shell 430 and the outer boundary shell 432. For example, at 206, a section of the external shell 332 that defines a face of the crankshaft 100 may be axially aligned with corresponding sections of the inner boundary shell 430 and the outer boundary shell 432 that define the same face, for example. The face may be a first end 118 or a second end 120 or one of the various other faces of the crankshaft 100. As another example, a section of the external shell 332 that defines a pair of faces of the crankshaft 100 may be centered relative to corresponding sections of the inner boundary shell 430 that defines the same pair of faces and also centered relative to corresponding sections of the outer boundary shell 432 that also defines the same pair of faces. In either case, the model 300 may be a three dimensional array, and the inner boundary shell 430 and the outer boundary shell 432 may also be three dimensional arrays, both of which could be aligned with one another. While the face(s) of the crankshaft 100 is used in these illustrative embodiments, other sections of the crankshaft 100 may also be used, using the same general methodology.

At 208, the processing unit 130 may radially align the external shell 332 with the corresponding sections of the inner boundary shell 430, and also may radially align the external shell 332 with corresponding sections of the outer boundary shell 432. In one embodiment of the method 200, at 208, the processing unit 130 may radially align the slices 326 of the external shell 332 with the corresponding slices 426 of the inner boundary shell 430 and the outer boundary shell 432.

At 208, the radial alignment may include aligning a section of the external shell 332 that defines one or more of the crankpin journals 110 with the corresponding section(s) of the inner boundary shell 430 and the outer boundary shell 432. As another example, at 208, the radial alignment may include aligning a section of the external shell 332 defines one or more of the arms 108 (or counterweights 106) with the corresponding section(s) of the inner boundary shell 430 and the outer boundary shell 432. And as yet another example, at 208, the radial alignment may include aligning a section of the external shell 332 of the crankshaft 100 that defines, for example, a face of the crankshaft 100 (e.g., a face of a web) with a corresponding section of the inner boundary shell 430 and the outer boundary shell 432. In all such examples, the model 300, the inner boundary shell 430, and the outer boundary shell 432 may be three dimensional arrays, all of which could be aligned with one another, so as to radially align respective features thereof.

At 210, the processing unit 130 compares the model 300 to the inner boundary shell 430 and to the outer boundary shell 432. For example, the processing unit 130 may compare the slices 326 of the external shell 332 to the corresponding slices 426 of the inner boundary shell 430 and the outer boundary shell 432. And at 212, the processing unit 130 determines whether the crankshaft 100 is suitable for machining into the machined crankshaft based on the model 300. The crankshaft 100 may be suitable for machining if it has enough material (e.g., robust webs), if it is suitable for a standard set of machining operations without a high risk of damage to the machine tools associated therewith, and/or if it is capable of meeting design and use requirements related thereto.

At 214, the processing unit 130 provides instructions to machine the crankshaft 100 if the determining indicates that the crankshaft 100 is suitable for machining into the machined crankshaft. For example, at 214, the processing unit 130 provides instructions to machine the crankshaft 100 if the comparing indicates that all portions of the external shell 332 are radially outside of the inner boundary shell 430, and/or if the comparing indicates that all portions of the external shell 332 are radially inside of the outer boundary shell 432. Typical machining operations may include broaching, drilling, and grinding techniques.

At 216, the processing unit 130 provides instructions to discard the crankshaft 100 if the determining indicates that the crankshaft 100 comprises insufficient material, or if the crankshaft 100 comprises unwanted material. Discarding the crankshaft 100 may include, for example, recycling it or scrapping it. The crankshaft 100 may comprise insufficient material if, for example, it does not have enough material (e.g., weak webs with too little material). The crankshaft 100 may comprise unwanted material if a standard set of machining operations cannot be used for machining the crankshaft 100 into the machined crankshaft (e.g., it has extra material that may damage the machine tools). In one embodiment of the method 200, at 216, the processing unit 130 provides instructions to discard the crankshaft 100 if the comparing indicates that a portion of the external shell 332 is radially inside of the inner boundary shell 430, and/or if a portion of the external shell 332 is radially outside of the outer boundary shell 432. By discarding the crankshaft 100 early in the manufacturing process, there may be a considerable decrease in manufacturing costs and an overall increase in production line quality.

While the disclosure has been illustrated and described in detail in the drawings and foregoing description, such illustration and description is to be considered as exemplary and not restrictive in character, it being understood that illustrative embodiments have been shown and described and that all changes and modifications that come within the spirit of the disclosure are desired to be protected. It will be noted that alternative embodiments of the present disclosure may not include all of the features described yet still benefit from at least some of the advantages of such features. Those of ordinary skill in the art may readily devise their own implementations that incorporate one or more of the features of the present disclosure and fall within the spirit and scope of the present invention as defined by the appended claims.

The invention claimed is:

1. A method associated with a physical crankshaft, the method comprising:
receiving data related to a three dimensional scan of the physical crankshaft;
generating a crankshaft computer model based on the data;
determining whether the physical crankshaft is suitable for machining into a machined crankshaft based on the crankshaft computer model, the determining comprising comparing the crankshaft computer model to an inner boundary shell, the comparing comprising axially aligning the crankshaft computer model relative to the inner boundary shell, the crankshaft computer model representing an external shell of the physical crankshaft, the inner boundary shell representing a threshold between an entire crankshaft comprising an appropriate amount of material and an entire crankshaft comprising insufficient material;
deciding whether to physically discard the physical crankshaft based on the determination of whether the physical crankshaft is suitable for machining into the machined crankshaft; and
providing instructions to physically machine the physical crankshaft if the comparing indicates that all portions of the external shell are radially outside of the inner boundary shell.

2. The method of claim 1, further comprising providing instructions to physically discard the physical crankshaft if the determining indicates that the physical crankshaft comprises insufficient material.

3. The method of claim 1, further comprising providing instructions to physically discard the physical crankshaft if the determining indicates that the physical crankshaft comprises unwanted material.

4. The method of claim 1, further comprising providing instructions to physically machine the physical crankshaft if the determining indicates that the physical crankshaft comprises an appropriate amount of material.

5. The method of claim 1, further comprising providing instructions to physically discard the physical crankshaft if the comparing indicates that a portion of the external shell is radially inside of the inner boundary shell.

6. The method of claim 1, wherein the comparing comprises:
axially and radially aligning the external shell with corresponding sections of the inner boundary shell; and
comparing the external shell to the corresponding sections of the inner boundary shell.

7. The method of claim 1, wherein the determining comprises comparing the crankshaft computer model to an outer boundary shell, and the outer boundary shell represents a threshold between an entire crankshaft comprising an appropriate amount of material and an entire crankshaft comprising unwanted material.

8. The method of claim 7, further comprising providing instructions to physically machine the physical crankshaft if the comparing indicates that all portions of the external shell are radially inside of the outer boundary shell.

9. The method of claim 7, further comprising providing instructions to physically discard the physical crankshaft if the comparing indicates that a portion of the external shell is radially outside of the outer boundary shell.

10. The method of claim 7, wherein the comparing comprises:
axially and radially aligning the external shell with corresponding sections of the outer boundary shell; and
comparing the external shell to the corresponding sections of the outer boundary shell of the crankshaft.

11. The method of claim 1, wherein the determining comprises:
comparing the crankshaft computer model to an outer boundary shell, the outer boundary shell represents a threshold between an entire crankshaft comprising the appropriate amount of material and an entire crankshaft comprising unwanted material; and
providing instructions to physically machine the physical crankshaft if the comparing indicates that all portions of the external shell are radially inside of the outer boundary shell.

12. The method of claim 11, further comprising providing instructions to physically discard the physical crankshaft if the comparing indicates that a portion of the external shell is radially inside of the inner boundary shell or a portion of the external shell is radially outside of the outer boundary shell.

13. A device comprising:
a processing unit;
a memory;

receiving data stored in the memory related to a three dimensional scan of a physical crankshaft by the processing unit;

generating a crankshaft computer model based on the data;

determining whether the physical crankshaft is suitable for machining into a machined crankshaft based on the crankshaft computer model, the determining comprising comparing the crankshaft computer model to an inner boundary shell, the comparing comprising axially aligning the crankshaft computer model relative to the inner boundary shell, the crankshaft computer model representing an external shell of the physical crankshaft, and the inner boundary shell representing a threshold between an entire crankshaft comprising an appropriate amount of material and an entire crankshaft comprising insufficient material; and providing instructions to physically machine the physical crankshaft if the comparing indicates that all portions of the external shell are radially outside of the inner boundary shell.

14. The device of claim 13, further comprising providing instructions to physically discard the physical crankshaft if the determining indicates that the physical crankshaft comprises insufficient material.

15. The device of claim 13, further comprising providing instructions to physically discard the physical crankshaft if the determining indicates that the physical crankshaft comprises unwanted material.

16. The device of claim 13, further comprising providing instructions to physically machine the physical crankshaft if the determining indicates that the physical crankshaft comprises an appropriate amount of material.

17. The device of claim 13, further comprising providing instructions to physically discard the physical crankshaft if the comparing indicates that a portion of the external shell is radially inside of the inner boundary shell.

18. The device of claim 13, wherein the determining comprises comparing the crankshaft computer model to an outer boundary shell, and the outer boundary shell represents a threshold between an entire crankshaft comprising an appropriate amount of material and an entire crankshaft comprising unwanted material.

19. The device of claim 18, further comprising providing instructions to physically machine the physical crankshaft if the comparing indicates that all portions of the external shell are radially inside of the outer boundary shell.

20. The device of claim 18, further comprising providing instructions to physically discard the physical crankshaft if the comparing indicates that a portion of the external shell is radially outside of the outer boundary shell.

* * * * *